(12) United States Patent
Flynn et al.

(10) Patent No.: US 6,991,110 B2
(45) Date of Patent: Jan. 31, 2006

(54) PACKAGE FOR STORING SENSOR CRYSTALS AND RELATED METHOD OF USE

(75) Inventors: Robert F. Flynn, Dewitt, NY (US); Christopher W. Cipro, Syracuse, NY (US); Jon Hughes, Fairport, NY (US); Paul Harold Lindsay, Vernon, NY (US)

(73) Assignee: Inficon, Inc., East Syracuse, NY (US)

( * ) Notice: Subject to any disclaimer, the term of this patent is extended or adjusted under 35 U.S.C. 154(b) by 265 days.

(21) Appl. No.: 10/612,424

(22) Filed: Jul. 2, 2003

(65) Prior Publication Data
US 2005/0000851 A1    Jan. 6, 2005

(51) Int. Cl.
*B65D 85/30* (2006.01)

(52) U.S. Cl. .................. 206/725; 533/704; 533/722; 221/87

(58) Field of Classification Search ............ 206/303, 206/445, 533, 538, 701, 704, 722, 723, 725, 206/454; 221/69, 87
See application file for complete search history.

(56) References Cited

U.S. PATENT DOCUMENTS

| | | | |
|---|---|---|---|
| 3,870,192 A * | 3/1975 | Haley | 221/86 |
| 5,117,977 A * | 6/1992 | Voroba | 206/704 |
| 5,948,983 A | 9/1999 | Gogol, Jr. et al. | |
| 6,325,241 B1 * | 12/2001 | Garde et al. | 221/87 |
| 2002/0153278 A1 * | 10/2002 | Pirro et al. | 206/704 |

\* cited by examiner

*Primary Examiner*—Mickey Yu
*Assistant Examiner*—Jerrold Johnson
(74) *Attorney, Agent, or Firm*—Wall Marjama & Bilinski LLP

(57) ABSTRACT

A package for retaining at least one crystal for use with vacuum deposition processing apparatus includes a tray portion having at least one vertically disposed supporting slot sized for retaining a crystal and a cover portion overlaying the tray portion. The cover portion is rotated until a slotted opening of the cover portion is aligned with a vertical supporting slot, permitting removal of the crystal that is supported within the vertical slot only along its peripheral edges.

16 Claims, 4 Drawing Sheets

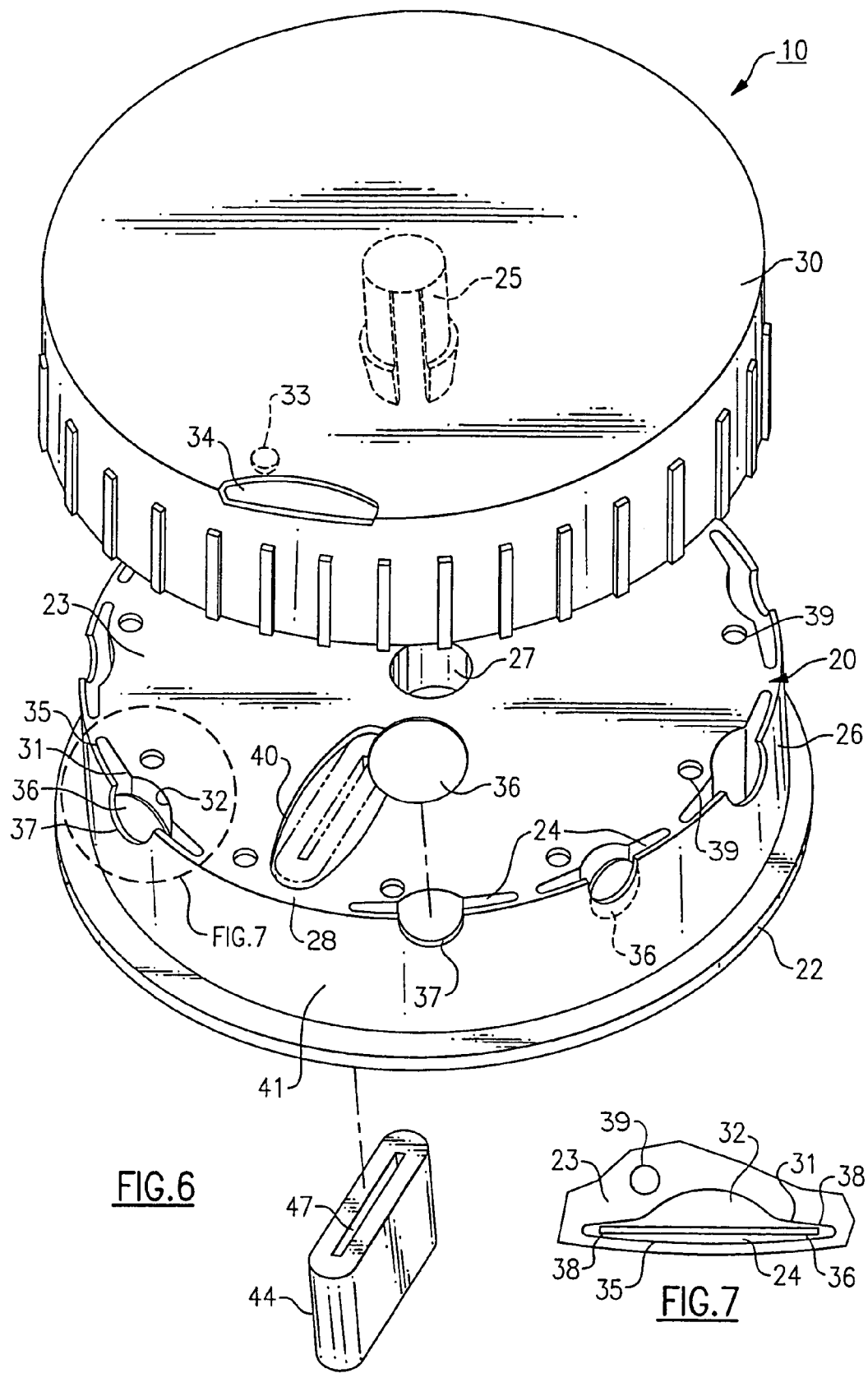

PACKAGE FOR STORING SENSOR CRYSTALS AND RELATED METHOD OF USE

FIELD OF THE INVENTION

This invention relates generally to the field of semiconductors and more particularly to a package for retaining a plurality of crystals for replacement use in a sensor assembly that is utilized in vacuum deposition processing.

BACKGROUND OF THE INVENTION

There is known packaging in existence for housing replacement sensor crystals that are to be used in vacuum deposition processing apparatus, such as for optical coating applications. These crystals are thin disc-like quartz elements that are incorporated into a sensor assembly which can be disposed within or otherwise provided relative to a vacuum deposition chamber. The crystals are manufactured with a circularly shaped active region in the center of the crystal which upon placement into the sensor assembly can be resonated upon application of a proper voltage. This resonance can be used to determine the rate and thickness of deposition in the chamber and hence wafer thickness. Due to the exposure environment, it is expected that these crystals, on occasion, must be replaced. To that end, crystal sensor assemblies are constructed to permit replacement of used or worn sensors.

Referring to FIG. 1, a first prior art replacement crystal package 100 includes a box-like enclosure 104 that is sized to store a predetermined number of crystals 36, the crystals being separated from one another in the stacked arrangement by a series of alternating static-free paper inserts 112 that sandwich each crystal. In order to remove a crystal 36 from the package 100, the box-like enclosure 104 must first be opened and then a paper insert 112 must be removed prior to removing a crystal therefrom, usually with tweezers (not shown). This particular package design has a number of disadvantages. First, a storage system as described in FIG. 1 is expensive to manufacture as well as highly labor intensive. Second and perhaps more significantly, each of the crystals 36 are evenly supported, including their sensitive center regions 42, on the paper inserts 112, potentially subjecting the crystals to damage prior to their use.

Referring to FIG. 2, a second prior art crystal package 120 is depicted. In this particular package design, a plurality of crystals 36 are horizontally supported within a plurality of spaced recesses 128 that are disposed about the outer periphery of a plastic-molded tray portion 132. A transparent cover 136 is placed in overlaying relation to the tray portion 132, the cover including a single opening 140 that can be aligned, through rotation of the cover, with one of the spaced recesses 128.

Rotation of the cover 136 permits removal of a crystal 36 by means of tweezers (not shown) that can engage the edges of a crystal or removal can be alternatively effected by "flipping" the package 120 and permitting a stored crystal to fall through the aligned cover opening 140.

A number of disadvantages are also found using this latter crystal package design. First, the recesses 128 are constructed to evenly support each crystal 36, as in the first instance, including the active center area 42 which is therefore essentially unprotected during storage. Second, it is possible that any or all of the stored crystals 36 can be dislodged prematurely from any one of the recesses 128. Subsequently, the dislodged crystal(s) can become wedged between the cover 136 and the tray portion 132 when the cover is rotated or when the package 120 is tipped for removal of a crystal 36, causing possible damage to a crystal or otherwise preventing the crystal from being removed, without a certain degree of manipulation or by destroying the package 120.

SUMMARY OF THE INVENTION

It is a primary object of the present invention to overcome the above-noted deficiencies of the prior art.

It is another primary object of the present invention to provide an improved package for adequately and securely storing crystals used in sensor assemblies for vacuum deposition processing apparatus wherein a crystal can be easily removed.

It is yet another primary object of the present invention to provide an improved crystal storage receptacle and removal technique that does not degrade the active central region of a stored crystal.

Therefore and according to a preferred aspect of the present invention, there is described a package for storing a plurality of crystals for a vacuum deposition processing apparatus, said crystals having a disc-like configuration including an active region at the center of at least one side thereof, said package comprising a tray portion including a plurality of vertically arranged supporting slots, each of said supporting slots being sized for receiving a crystal.

Preferably, each of the vertically arranged supporting slots are formed in the tray portion so as to retain the peripheral edges of the crystals, while not contacting the active center region. The supporting slots are preferably disposed on the outer periphery of a circular or other shaped tray, wherein the package further includes an overlaying cover having an opening wherein the cover can be selectively rotated relative to a vertically arranged supporting slot to permit removal of a crystal from the package. In addition, the package can further include means for retaining a removal tool that permits a crystal to be more conveniently removed from the package. Alternatively, the package can be oriented to allow a crystal to be easily released from the package without requiring tools, or tweezers or other tools can be used to effect removal.

According to yet another preferred aspect of the present invention, there is disclosed a method for storing and removing at least one of a plurality of disc-like crystals that are used in a vacuum deposition processing apparatus, each of said crystals having an active center region on one side thereof, said method including the steps of:

providing a package having a plurality of vertically arranged slots on a tray portion, each of said slots being configured to retain a said crystal without contacting the center region of said crystal, said package further including a cover covering said slots;

rotating said cover about said tray portion until a slotted opening of said cover is aligned with a vertical slot; and removing a said crystal.

An advantage of the present invention is that sensor crystals can be stored in a convenient manner wherein the crystal is not supported at its active center region, therefore minimizing the opportunity for premature damage.

Another advantage of the present invention is that the package supporting the crystals is easier and more inexpensive to manufacture than previously known packages.

These and other objects, features and advantages will be readily apparent from the following Detailed Description which should be apparent from the accompanying drawings.

BRIEF DESCRIPTION OF THE DRAWINGS

FIG. 6 is an exploded view of the crystal package of FIGS. 5A and 5B;

FIG. 7 is a top view of a vertical supporting slot of the crystal package of FIGS. 5A, 5B and 6;

DETAILED DESCRIPTION

Figure 1:
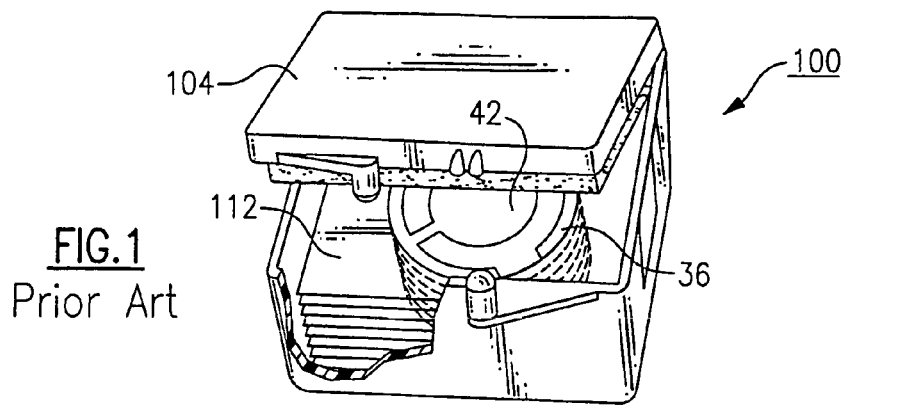
FIG. 1 is a side elevation view, partially broken away, of a first prior art crystal package.

The following description relates to a preferred embodiment of a crystal package used for storing a plurality of crystals that are used in sensor assemblies utilized in connection with vacuum deposition processing apparatus, as well as alternative methods for the removal of stored crystals from the described package. Throughout the course of discussion, several terms such as "exterior", "upper", "lower", "top", "bottom" and the like are frequently used to define a frame of reference with regard to the accompanying drawings. It is not intended, however, unless specifically stated otherwise, that these terms are intended to be overly limiting of the present invention.

Referring to FIGS. 5A–7, the crystal package 10 is defined by a tray portion 20 and a cover portion 30. Each of the above portions are circular in shape for purposes of this embodiment, though other configurations can easily be imagined. The tray portion 20 includes a lower base section 22 and an upper supporting section 26, each of the these sections being formed preferably as part of a single lightweight plastic molded component. The upper supporting section 26 includes a plurality of vertical supporting slots 24, each of the slots being disposed adjacent the outer periphery of a top surface 23. Each of the vertical supporting slots 24 are preferably equally spaced from one another so as to define respective storage positions for the crystals 36, with the exception of an additional spacing between two of the slots. This additional spacing is used to define an initial locating position 28 for aligning with a slotted opening 34 of the cover portion 30, as noted below. According to the present embodiment, a total of ten (10) vertical supporting slots 24 are provided, though the actual number of slots can be varied, for example, according to the size and diameter of the tray portion 20, as required.

The cover portion 30 is used to overlay the upper supporting section 26 of the circular tray portion 20, the cover portion including a slotted opening 34 provided along the outer periphery of a top surface 29 thereof. Following manufacture, the slotted opening 34 is aligned with the defined initial locating position 28 of the tray portion 20, as shown more particularly in FIG. 6. The spacing between the slots 24 used to define this position 28 is sized to include the slotted opening 34 and permits the cover portion 30 to be initially positioned relative to the tray portion 20 following manufacture, insuring that the slotted opening 34 is not indexed initially onto a vertical supporting slot 24 containing a crystal 36 that can be inadvertently dropped from the package.

The cover portion 30 is mounted for rotation onto the tray portion 20, through a slotted post 25 extending from the center of the bottom of the cover portion 30 that is inserted into an opening 27 formed in the center of the upper supporting section 26 of the tray portion 20. In addition and according to this embodiment, a detent pin 33 extends from an interior surface of the cover portion 30 for engaging one of a plurality of detent holes 39, each disposed in relation to each of the vertical supporting slots 24 and the initial locating position 28. Engagement of the detent pin 33 with a detent hole 39 provides repeatable location and aligns the slotted opening 34 with the tray portion 20, either initially with position 28 or for removal of a crystal through a vertical supporting slot 24. Each of the tray portion 20 and the cover portion 30 are preferably fabricated from a moldable plastic material, such as polyethylene, ABS or the like, though other suitable materials, such as polyamide could also be utilized.

Figures 3, 4:
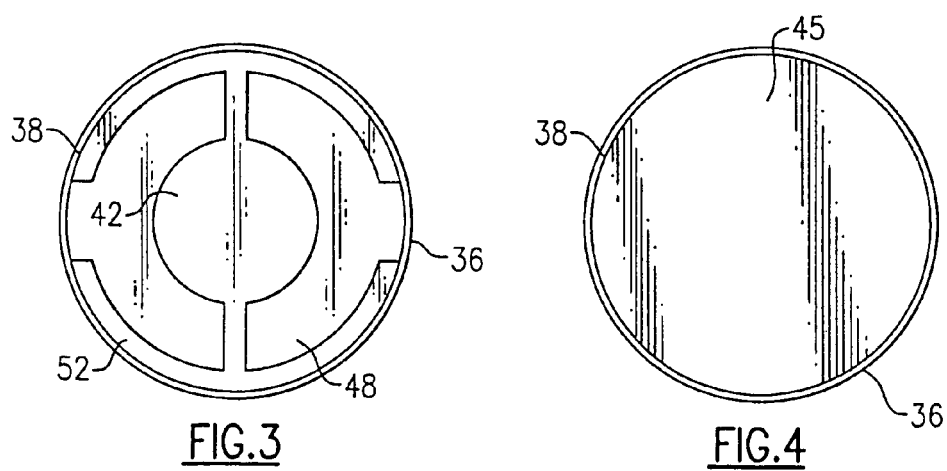
FIG. 3 is a top plan view of a crystal supported by the packages described herein.
FIG. 4 is a bottom view of the crystal of FIG. 3.
Figure 10:
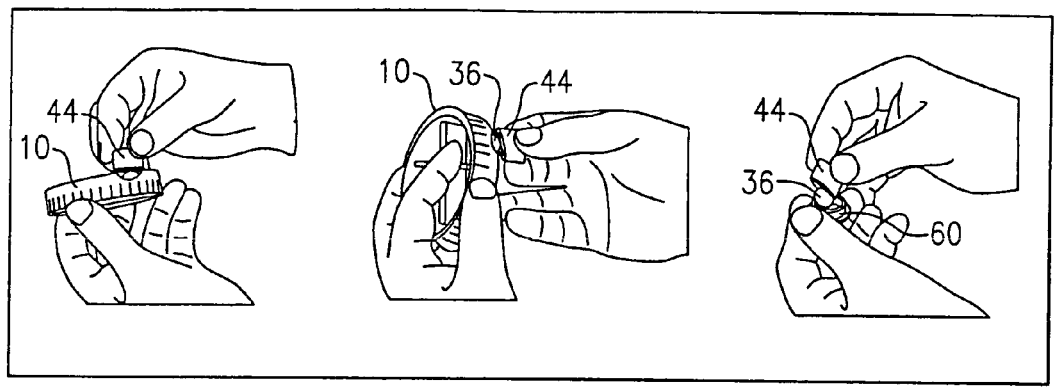
FIG. 10 illustrates a third crystal removal method using the crystal package of FIGS. 5A–7.
Figure 8:
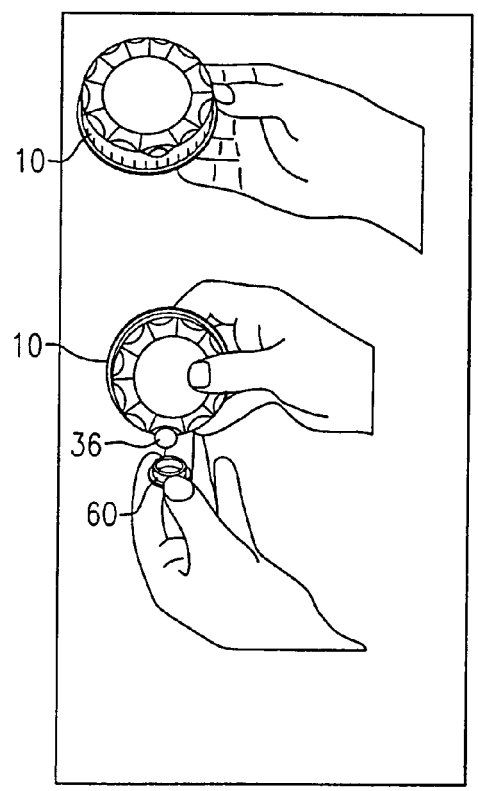
FIG. 8 illustrates a first crystal removal method using the crystal package of FIGS. 5A–7.
Figure 9:
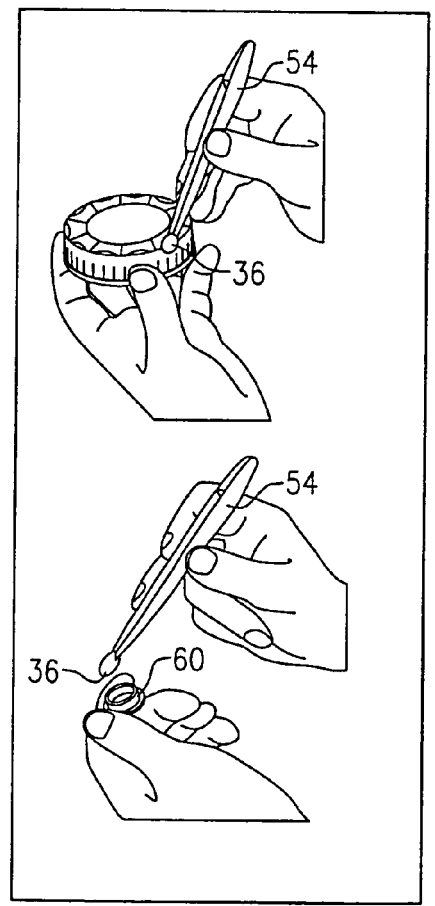
FIG. 9 depicts a second crystal removal method using the crystal package of FIGS. 5A–7.

As shown in FIGS. 3 and 4, each of the crystals 36 are thin disc-like elements having a circularly shaped active region 42 in the center of the crystal which upon placement into a sensor assembly, a sensor cover 60 for which is shown in FIGS. 8–10, can be resonated upon application of a proper voltage. The crystal 36 includes a pair of opposing sides 45, 48. Each opposing side 45, 48 of the crystal 36 is coated with a layer of electrically conductive material that is resistant and non-reactive with the process environment in the interior of a vacuum processing chamber (not shown). Side 45 is fully coated and side 48, commonly referred to as the patterned side, is coated mainly on the outer periphery, to define an electrical contacting surface or electrode 52. According to the present embodiment, the crystal 36 is coated with a highly conductive material, typically gold or silver is suitable. The circularly shaped active region 42 is defined in the center of the crystal 36, which can be resonated upon application of a proper voltage upon installation into the sensor cover 60, FIGS. 8–10 and installed into the sensor assembly (not shown). Additional details relating to the theory and manufacture of quartz-crystal sensors are commonly known to those in the field, as described in the text: *Introduction to Quartz Crystal Unit Design*; by Virgile E. Bottom, published 1981, the entire contents of which is hereby incorporated by reference. Further details relating to a wall deposition system using quartz-crystal sensors can be found in commonly owned U.S. Pat. No. 5,948,983, the entire contents of which are also incorporated in their entirety. Therefore, no additional discussion of the above features is believed to be needed, except as required in describing the present invention.

The circular tray portion 20 of the crystal package 10 of the present embodiment further includes an elongate slot 40 formed in the top surface 23 of the upper supporting section 26 that is sized to retain a crystal removal tool 44, described in greater detail below. The removal tool 44 can be releasably attached through tabs (not shown) or alternately other forms of attachment or can be separately attached to the package as part of an overmold (not shown) to the bottom of the tray portion 20.

Figure 5A:
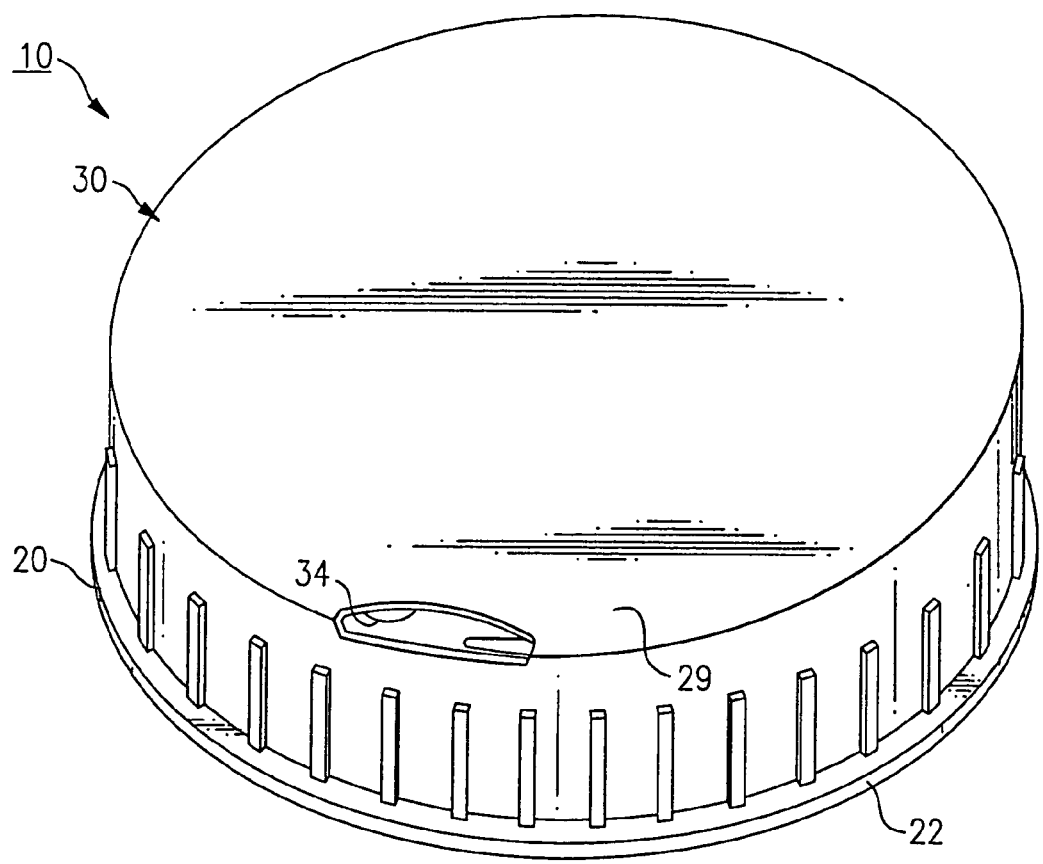
FIG. 5A is a top isometric view of a crystal package in accordance with the present invention.
Figure 5B:
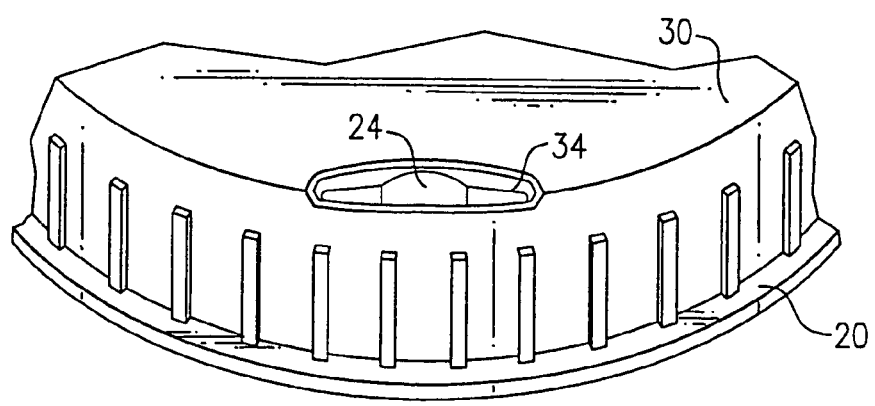
FIG. 5B is a partial enlarged top isometric view of the crystal package of FIG. 5A.

The vertical supporting slots 24 are herein described in greater detail with reference to FIGS. 5B, 6 and 7. The slots 24, as noted previously, are formed in the top surface 23 of the upper supporting section 26 of the tray portion 20 of the package 10 adjacent the outer periphery thereof. Each slot 24 are defined by an inner wall 31 and an outer wall 35. Each of the walls 31, 35 are parallel to one another and extend vertically, the outer wall having a center scalloped portion 37 that permits access to the crystal from a sidewall 41 of the tray portion 20 and the inner wall having a center recess 32 that extends radially inward toward the center of the tray portion. In this configuration, the crystal 36 is therefore supported substantially only at its peripheral edges 38 between the inner and outer walls 31, 35 and the bottom of the supporting slots 24, the slots having a depth permitting the center of each side 45, 48, of the crystals 36, FIGS. 3, 4, to be located either in the center scalloped portion 37 or the center recess 32.

Having described the structural details of the above package 10, reference is now made to FIGS. 8–10 that detail alternative techniques for removing a crystal(s) from the package.

Referring to FIG. 8, a first crystal removal method is herein described for use with the above package 10. First, the cover portion 30 is rotated such that the slotted opening 34 is properly aligned with one of vertical supporting slots 24 of the tray portion 20. The package 10 is then oriented on its side, permitting the crystal 36 to freely fall through both the aligned openings 34, 24 into the confines of a sensor cover 60. Because the vertical supporting slots 24 of the tray portion 20 do not contact the active center area 42 of the crystal(s) 36, there is less chance of damage prior to removal thereof.

Figure 2:
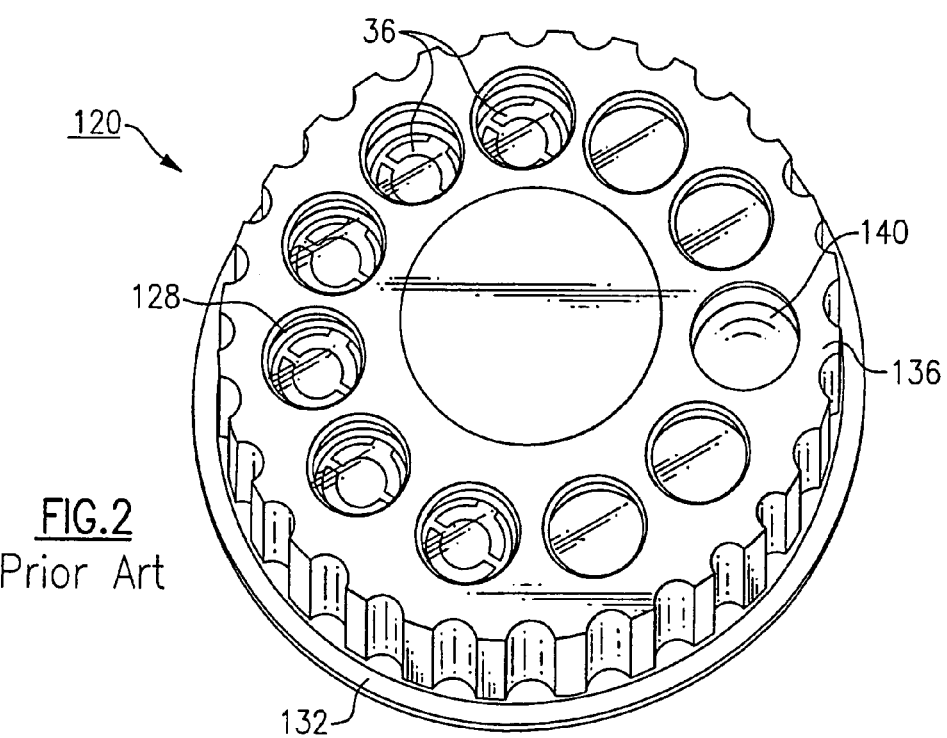
FIG. 2 is a top isometric view of a second prior art crystal package.

Referring to FIG. 9, a second crystal removal method is herein described in accordance with the package 10 of the present embodiment. According to this removal method, the cover portion 30 is first rotated as in the preceding, such that the slotted opening 34 is aligned with a desired vertical supporting slot 24 of the tray portion 20. The crystal 36 contained within the slot 34 can then be removed either with or without reorienting of the package 10 by means of a pair of tweezers 54. From the tweezers 54, the crystal can then be gripped at its edges 38 and placed into a sensor cover 60. Due to the vertical support orientation, it is much simpler for the user to be able to grip a peripheral edge 38 of the crystal 36 to effect removal as opposed to the prior art packages previously discussed in FIGS. 1 and 2.

Referring to FIG. 10, a third crystal removal method is herein described in accordance with the present invention. This method is similar to the preceding except that other than tweezers, a removal tool 44 is used to retain a crystal 36 prior to placing same into the sensor cover 60. The removal tool 44 includes a cavity or slot 47 that is sized for receiving the crystal 36 after the openings have been aligned and the package has been oriented on its side so that the crystal 36 can be gripped by the removal tool 44 that is sized to engage the opening 34 and retrieve the crystal. Alternately, and as previously noted, the removal tool 44 can otherwise be provided in a molded portion (not shown) on the underside of the package or can be provided as a separate accessory. Again, the vertical support orientation of the crystal 36 within the package 10 permits relatively simple alignment with the vertical slot 47 of the removal tool 44, as opposed to prior art removal techniques.

PARTS LIST FOR FIGS. 1–10

| | |
|---|---|
| 10 | crystal package |
| 20 | tray portion |

-continued

PARTS LIST FOR FIGS. 1–10

| | |
|---|---|
| 22 | lower base section |
| 23 | top surface |
| 24 | vertical supporting slots |
| 25 | slotted post |
| 26 | upper supporting section |
| 27 | opening |
| 28 | initial locating position |
| 29 | top surface |
| 30 | cover portion |
| 31 | inner wall |
| 32 | center recess |
| 33 | detent pin |
| 34 | slotted opening |
| 35 | outer wall |
| 36 | crystals |
| 37 | center scalloped region |
| 38 | peripheral edges |
| 39 | detent holes |
| 40 | slot |
| 41 | sidewall |
| 42 | active center area or region |
| 44 | removal tool |
| 45 | side |
| 47 | slot |
| 48 | side |
| 52 | electrode |
| 54 | tweezers |
| 60 | sensor cover |
| 100 | package |
| 104 | enclosure |
| 112 | insert, paper |
| 120 | package |
| 128 | recesses |
| 132 | tray portion |
| 136 | cover, transparent |
| 140 | opening |

Though the present invention has been described in terms of certain preferred embodiments, it should be appreciated that other variations and modifications are possible within the scope of the following listed claims.

We claim:

1. A package for retaining and dispensing at least one semiconductor crystal for use in a processing apparatus, said package comprising:
   a plurality of semiconductor crystals, each of said crystals being defined by a planar disk structure having peripheral edges and further including a center active region on at least one side thereof;
   a tray portion having a plurality of vertically disposed supporting slots for retaining a said plurality of crystals, each of said vertically disposed supporting slots being configured to support only the peripheral edges of each said crystal retained therein; and
   a cover portion rotatably mounted in overlaying fashion relative to said tray portion, said cover portion including a slotted opening permitting alignment with at least one said vertically disposed supporting slot of said tray portion.

2. A package according to claim 1, wherein said tray portion is circular.

3. A package according to claim 1, including a crystal removal tool, and means for retaining said crystal removal tool.

4. A package according to claim 3, wherein said removal tool is releasably attached to said package.

5. A package according to claim 4, wherein said removal tool includes a vertical slot that can be aligned with a vertically disposed supporting slot.

6. A package according to claim 2, wherein a plurality of said crystal packages can be stacked for storage.

7. A package according to claim 6, wherein a plurality of said packages can be stacked vertically.

8. A package according to claim 1, wherein each vertically disposed supporting slot includes an inner wall and an outer wall, said inner wall having an inwardly radially extending recess, said recess being sized to permit said peripheral edges of a said crystal to contact said inner wall but in which said center active region is aligned with said recess such that said center active region is protected from contact within the package.

9. A package according to claim 8, wherein each vertically disposed supporting slot includes an inner wall and an outer wall, said outer wall including a center scalloped region to permit access to a supported crystal.

10. A package according to claim 1, including a detent mechanism for permitting the slotted opening of the cover portion to be indexed to a plurality of radial positions relative to the tray portion.

11. A package according to claim 2, wherein each of said supporting slots are substantially equally spaced between each other in a circumferential manner with the exception of a larger spacing between at least two of said slots defining a position for aligning initially with said slotted opening of said cover portion.

12. A method for packaging a plurality of disc-like crystals for use in vacuum deposition processing apparatus, each of said crystals having an active center region on one side thereof, said method including the steps of:

providing a package having a plurality of vertically arranged slots on a tray portion, each of said slots including means for retaining a said crystal without contacting the center region of said crystal, said package further including a cover covering said slots;

rotating said cover about said tray portion until a slotted opening of said cover is aligned with a vertical slot; and removing a said crystal.

13. A method as recited in claim 12, wherein said removing step includes the step of using a pair of tweezers.

14. A method as recited in claim 12, wherein said removing step includes the step of removing a said crystal using a removal tool.

15. A method as recited in claim 14, wherein said removal tool includes a vertical slot, said removing step further including the step of aligning said vertical slot with the aligned openings of said package and allowing said crystal to be retained by said tool.

16. A method as recited in claim 14, wherein said removal tool is provided on said package.

* * * * *